United States Patent
He et al.

(10) Patent No.: US 10,923,312 B2
(45) Date of Patent: Feb. 16, 2021

(54) MAGNETIC LENS AND EXCITING CURRENT CONTROL METHOD

(71) Applicant: Focus-eBeam Technology (Beijing) Co., Ltd., Beijing (CN)

(72) Inventors: Wei He, Beijing (CN); Shuai Li, Beijing (CN)

(73) Assignees: FOCUS-EBEAM TECHNOLOGY (BEIJING) CO., LTD., Beijing (CN); ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/740,291

(22) PCT Filed: Sep. 5, 2017

(86) PCT No.: PCT/CN2017/100465
§ 371 (c)(1),
(2) Date: Dec. 27, 2017

(87) PCT Pub. No.: WO2018/107823
PCT Pub. Date: Jun. 21, 2018

(65) Prior Publication Data
US 2019/0295808 A1    Sep. 26, 2019

(30) Foreign Application Priority Data
Dec. 14, 2016 (CN) .......................... 201611152870.6

(51) Int. Cl.
*H01J 37/141* (2006.01)
*H01J 37/24* (2006.01)
*H01J 37/26* (2006.01)

(52) U.S. Cl.
CPC ............ *H01J 37/141* (2013.01); *H01J 37/24* (2013.01); *H01J 37/241* (2013.01); *H01J 37/26* (2013.01);
(Continued)

(58) Field of Classification Search
None
See application file for complete search history.

(56) References Cited

U.S. PATENT DOCUMENTS 7,019,308 B2    3/2006 Dean
9,595,359 B2    3/2017 Shanel
(Continued)

FOREIGN PATENT DOCUMENTS

CN    104299872 A    1/2015
CN    106783492 A    5/2017
(Continued)

OTHER PUBLICATIONS

Supplementary European Search Report in European application No. 17807685.7, dated Nov. 6, 2018.
(Continued)

*Primary Examiner* — James Choi
(74) *Attorney, Agent, or Firm* — Syncoda LLC; Feng Ma

(57) ABSTRACT

A magnetic lens is disclosed, which includes: a magnetic yoke, an exciting coil and a power supply controlling system. The magnetic yoke is at outside of the exciting coil and surrounds the coil; the exciting coil is made up of litz wires; the power supply controlling system is arranged to supply power to the exciting coil and control the flow directions and magnitudes of the currents in the exciting coil. A method for controlling the magnetic lens is also disclosed.

6 Claims, 12 Drawing Sheets

(52) U.S. Cl.
CPC . *H01J 2237/141* (2013.01); *H01J 2237/1415* (2013.01); *H01J 2237/152* (2013.01)

(56) References Cited

U.S. PATENT DOCUMENTS

| | | | |
|---|---|---|---|
| 2004/0164831 | A1 | 8/2004 | Martin |
| 2006/0255896 | A1* | 11/2006 | Martin ............... H01J 37/147 336/61 |
| 2014/0296074 | A1* | 10/2014 | Kajikawa ........... G01R 33/3815 505/162 |
| 2014/0320132 | A1* | 10/2014 | Schmale ............. A61B 5/0515 324/322 |
| 2015/0021476 | A1 | 1/2015 | Shanel |
| 2015/0248961 | A1* | 9/2015 | Minen ................. C23C 2/003 335/219 |
| 2018/0269026 | A1* | 9/2018 | Hoque ............... H01J 37/1474 |

FOREIGN PATENT DOCUMENTS

| | | | |
|---|---|---|---|
| CN | 206451681 U | 8/2017 | |
| GB | 2405524 A | 3/2005 | |
| JP | 58103755 A * | 6/1983 | ............ H01J 37/10 |
| JP | H04116347 U | 10/1992 | |
| JP | 2004319378 A | 11/2004 | |
| JP | 2005079092 A | 3/2005 | |
| JP | 2013030276 A | 2/2013 | |
| WO | 2013015311 A | 1/2013 | |

OTHER PUBLICATIONS

International Search Report in international application No. PCT/CN2017/100465, dated Dec. 7, 2017.
English Translation of the Written Opinion of the International Search Authority in international application No. PCT/CN2017/100465, dated Dec. 7, 2017.

* cited by examiner

MAGNETIC LENS AND EXCITING CURRENT CONTROL METHOD

TECHNICAL FIELD

The present disclosure relates to the field of charged particle beam microscope, and in particular to a magnetic lens and an exciting current control method.

BACKGROUND

For the electromagnetic lens, focusing characteristics of the electromagnetic lens is changed by controlling the exciting current of the exciting coil. However, the exciting coil has a certain resistance, and therefore the temperature of the electromagnetic lens will change when the exciting current of the exciting coil varies; the temperature change will lead to thermal deformation of the magnetic yoke, the lens polepiece and the like and the change of the permeability of the magnetic materials, and finally impact the distribution of the magnetic field of the electromagnetic lens. For example, the thermal deformation of the electromagnetic lens structure will lead to nonuniformity of the magnetic field, and the change of the permeability of the magnetic material will impact the intensity of the magnetic field.

In order to control the temperature fluctuation of the lens caused by the thermal dissipation, one method is to use a water-cooling device to perform temperature control on the electromagnetic lens. However, the water-cooling method cannot solve the problem of the change of heating power, and cannot control the temperature precisely. The second method is to use the electromagnetic lens with double or multiple exciting coils. However, the thermal dissipation powers of the coils are not necessarily the same, moreover, the heat exchange will happen among the coils and this process will take some time to reach the heat balance, and therefore the temperature of the electromagnetic lens will fluctuate in the process.

SUMMARY

In view of this, embodiments according to the disclosure provide a magnetic lens as well as a method for controlling an exciting current, which is capable of changing the magnetic field intensity of the magnetic lens while keeping the thermal dissipation power of the exciting coil within the magnetic lens unchanged.

The technical solution according to the embodiments may be implemented as follows.

An embodiment of the disclosure provides a magnetic lens, comprising: a magnetic yoke, an exciting coil, and a power supply controlling system; wherein, the magnetic yoke is at outside of the exciting coil and surrounds the exciting coil; the exciting coil is made up of litz wires; and the power supply controlling system is arranged to supply power to the exciting coil and control flow directions and magnitudes of currents of the exciting coil.

In an implementation, the litz wires comprise a first group of wires and a second group of wires; wherein, a number of wires in the first group is as same as that in the second group, and the number is a positive integer larger than one.

In an implementation, the power supply controlling system comprises: a first power supply controller and a second power supply controller; wherein, the first power supply controller is arranged to supply power to the first group of wires and control the flow directions and magnitudes of the currents in the wires of the first group; the second power supply controller is arranged to supply power to the second group of wires and control the flow directions and magnitudes of the currents in the wires of the second group.

In an implementation, each of the first power supply controller and the second power supply controller includes one or more power supply controllers.

An embodiment of the disclosure provides a method for controlling a magnetic lens, wherein the magnetic lens has an exciting coil made up of litz wires, the method comprising: supplying power to the exciting coil by a power supply controlling system in the magnetic lens, and controlling flow directions and magnitudes of currents in the exciting coil, to vary a magnetic field intensity of the magnetic lens and keep a thermal dissipation power unchanged.

In an implementation, the litz wires comprise a first group of wires and a second group of wires; wherein, a number of the wires in the first group is as same as that of the wires in the second group, and the number is a positive integer larger than one.

In an implementation, the power supply controlling system comprises: a first power supply controller and a second power supply controller; and wherein the supplying power to the exciting coil by the power supply controlling system and controlling flow directions and magnitudes of currents in the exciting coil comprises: supplying power to the first group of wires by the first power supply controller, and controlling the currents in the wires of the first group to have a same direction and adjusting the magnitudes of the currents in the wires of the first group, to vary the magnetic field intensity of the magnetic lens; and supplying power to the second group of wires by the second power supply controller, and controlling the currents in the wires of the second group to have opposite directions and adjusting the magnitudes of the currents in the wires of the second group, to keep a total thermal dissipation power in the exciting coil unchanged.

In an implementation, each of the first power supply controller and the second power supply controller includes one or more power supply controllers.

According to the magnetic lens and the method for controlling characteristic of the magnetic lens provided in the embodiments of the disclosure, the exciting coil of the magnetic lens is made up of litz wires, and the power supply controlling system in the magnetic lens is arranged to supply power to the exciting coil and control the flow directions and magnitudes of the currents in the exciting coil; the litz wires include a first group of wires and a second group of wires; wherein, a number of the wires in the first group is as same as that of the wires in the second group; the currents in the wires of the first group are controlled to have a same direction and the magnitudes of the currents in the wires of the first group are adjusted, to vary the magnetic field intensity of the magnetic lens; and the currents in the wires of the second group are controlled to have opposite directions and the magnitudes of the currents in the wires of the second group are adjusted, to keep a total thermal dissipation power in the exciting coil unchanged; therefore, one can vary the intensity of the magnetic field of the magnetic lens and keep the total thermal dissipation power unchanged at the same time.

DETAILED DESCRIPTION OF THE EMBODIMENTS

The details are described as follows with reference to the Figures and several embodiments.

A magnetic lens excited with the current is called an electromagnetic lens, which is widely used in the charged particle apparatus in which the charged particles are to be focused, such as: scanning electron microscope (SEM), transmission electron microscope (TEM), focused ion beam (FIB) etc.; the electromagnetic lens usually includes a magnetic yoke with a high permeability, an exciting coil and a power supply controlling system. In contrast with the permanent magnetic lens, the advantage of the electromagnetic lens is the focusing characteristic of the electromagnetic lens is changeable by controlling the exciting current.

The focusing characteristic of the magnetic lens on the charged particles is determined by the intensity and distribution of the magnetic field of the magnetic lens, that is the size and focusing position of the beam spot formed by focusing the charged particles using the magnetic lens is closely related to the intensity and distribution of the magnetic field in the magnetic lens; the intensity and magnetic field distribution is determined by: the magnitude of the current in the exciting coil, the shape of the magnetic yoke and the permeability of the magnetic materials, anyone of the three factors has an impact on the intensity and distribution of the magnetic field in the magnetic lens, and finally impacts the focusing characteristic of the electromagnetic lens.

The details are described as follows with reference to the drawings and several embodiments.

Embodiment 1

Figure 1:
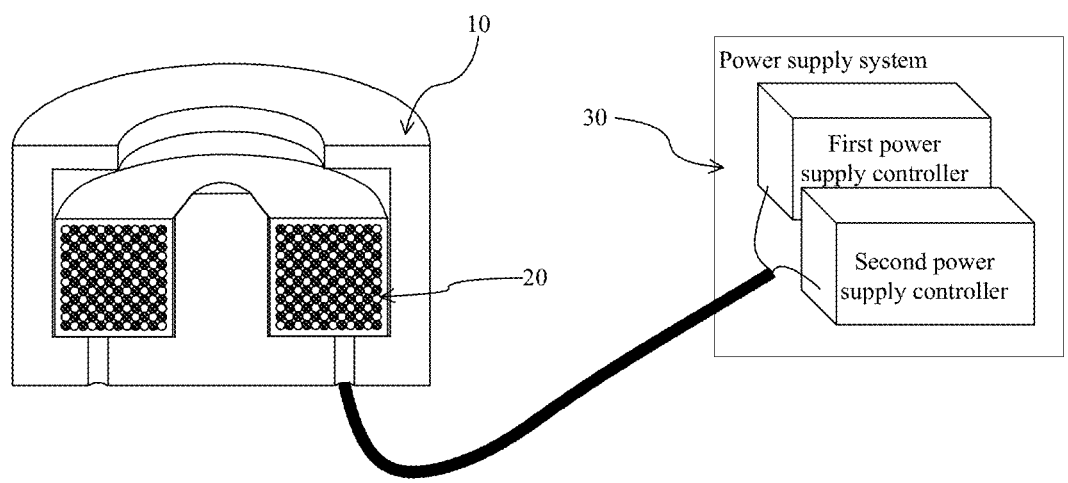
FIG. 1 is a diagram of the structure of a magnetic lens, according to an embodiment of the disclosure.

FIG. 1 is a diagram of the structure of a magnetic lens according to one embodiment of the disclosure, which comprises: a magnetic yoke 10, an exciting coil 20, and a power supply controlling system 30.

The exciting coil 20 is surrounded by the magnetic yoke 10.

The exciting coil 20 is made up of litz wires.

The power supply controlling system 30 is arranged to excite the coil 20 by controlling the direction and the magnitude of the current of the exciting coil 20.

In one embodiment of the disclosure, the litz wires consist of several wires, and these wires can be divided into the first group and the second group; wherein, the number of wires in the first group is the same as that in the second group, and this number is a positive integer larger than one.

Figure 2:
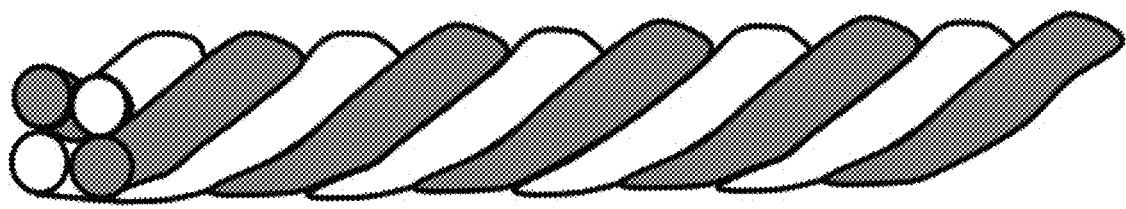
FIG. 2 is a diagram of litz wires, according to an embodiment of the disclosure.
Figure 3A:
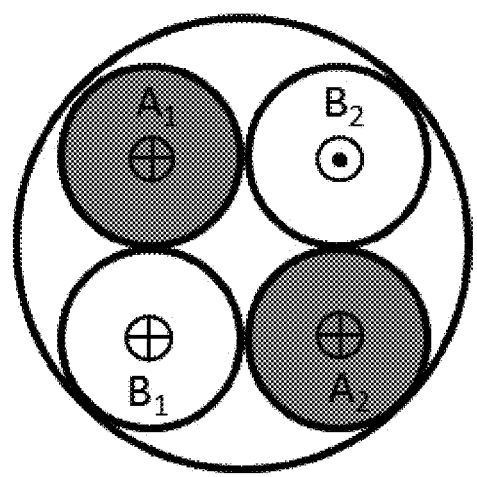
FIG. 3 is a diagram of an arrangement and current flow directions of wires, according to an embodiment of the disclosure.
Figure 3B:
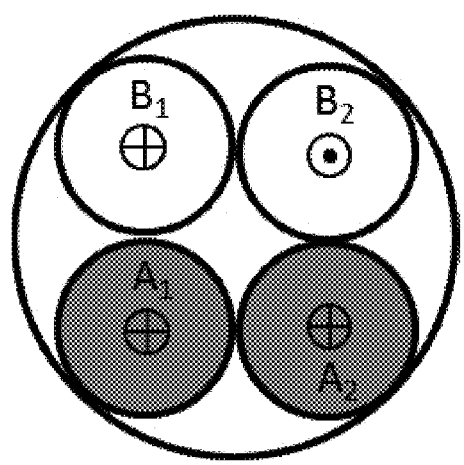
Figure 3C:
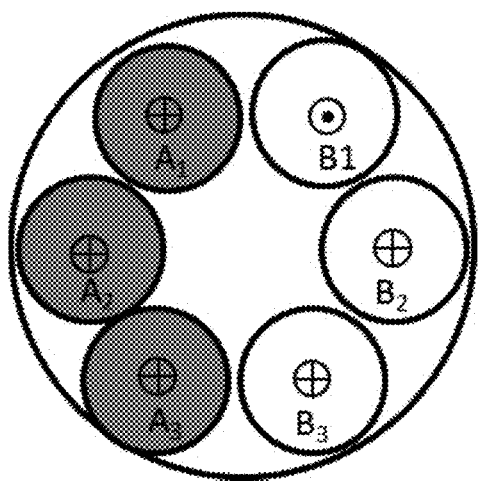
Figure 3D:
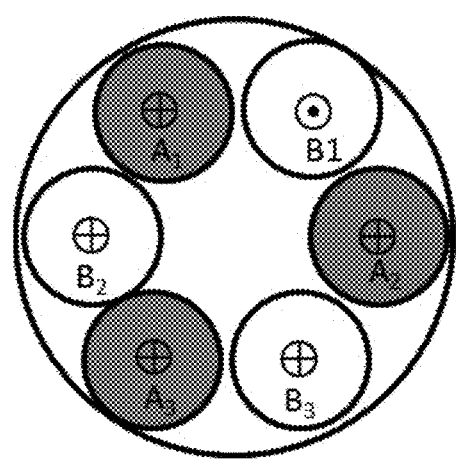

As an example, the litz wires consist of four wires, and then any one of the two groups consists of two wires, as shown in FIG. 2, in this case, in the structure of the litz wires, the first group of wires is represented by black wires, and the second group of wires is represented by white wires.

In one embodiment of the disclosure, the power supply controlling system 30 comprises the first power supply controller 3001 and the second power supply controller 3002; wherein, the first power supply controller 3001 supplies power to the first group of wires, controls the first group of wires to have a same current flow direction and controls the magnitudes of the currents in the first group of wires, to change the intensity of the magnetic field in the magnetic lens.

When the number of the second group of wires is an even number, the second power supply controller 3002 is arranged to supply power to the second group of wires, and controls the wires in the second group to have opposite current flow directions; since the current directions in the second group of wires are opposite to each other, the magnetic field intensity generated by the second group of wires can be set to be zero by controlling the magnitudes of the currents in the second group of wires; the second group of wires is only used to compensate the thermal dissipation in the first group of wires, in order to achieve a constant total thermal dissipation power in the whole coil and avoid the temperature fluctuation of the magnetic lens when the current in the first group of wires changes.

The number of the first power supply controller 3001 can be one or multiple, and the number of the second power supply controller 3002 can also be one or multiple.

When the number of the wires in the second group is an odd number, the second power supply controller 3002 is arranged to supply power to the second group of wires, and in addition to controlling the wires in the second group to have opposite current flow directions, the second power supply controller 3002 should further make sure that the sum of the current in one direction is equal to the sum of the current in another direction, only in this condition the magnitudes of the currents in the second group of wires would not influence the intensity of the magnetic field of the magnetic lens, i.e., the magnetic field produced by the second group of wires is zero.

In one embodiment of the disclosure, the arrangement and current directions of the wires in the first group and the second group is shown in FIG. 3. In FIG. 3A, two wires in the first group are deployed diagonally, and the current flow direction of the two wires in the first group are same; two wires in the second group are deployed diagonally, and the current flow direction of two wires in the second group are opposite. In FIG. 3B, two wires in the first group are arranged in parallel with the same current flow direction, and two wires in the second group are also arranged in parallel, but with the opposite current flow direction. In FIG. 3C, three wires in the first group are arranged adjacently with the same current flow direction, three wires in the second group are also arranged adjacently, while the current flow direction in two wires is opposite to that in another wire; in this condition, the sum of the current magnitude in the two wires should be equal to the magnitude in the another wire in order to keep the magnetic field produced by the second group of wires to be zero, and the second group of wires are only used to compensate the thermal dissipation in the first group to achieve a constant total thermal dissipation and avoid the temperature fluctuation of the magnetic lens caused by the current change in the first group of wires. In FIG. 3D, three wires in the first group and three wires in the second group are arranged alternatively. The current flow direction of the three wires in the first group is the same; the current flow direction of two wires in the second group is opposite to the current flow direction in another wire; in this condition, the sum of the current magnitude in the two wires should be equal to the magnitude in another wire, such that the magnitudes of the currents in the second group of wires would not influence the intensity of the magnetic field of the magnetic lens, i.e., the magnetic field produced by the second group of wires is kept to be zero, and the second group of wires is only used to compensate the thermal dissipation in the first group, to achieve a constant total thermal dissipation and avoid the temperature fluctuation of the magnetic lens caused by the current change in the first group of wires. Of course, the number of wires is not limited to that in the two cases mentioned above.

Figure 4:
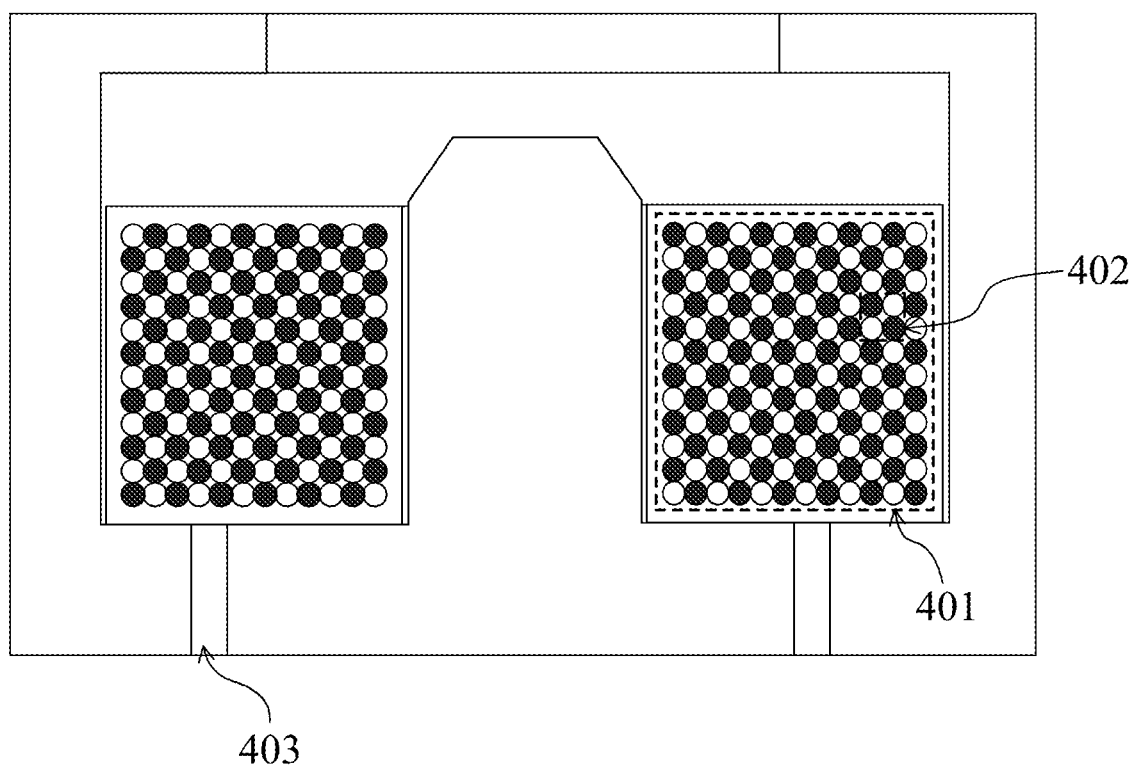
FIG. 4 is a diagram of a sectional view of the exciting coil in the magnetic lens, according to an embodiment of the disclosure.

FIG. 4 is a cross-section of the exciting coil in the magnetic lens according to one embodiment of the disclosure, reference sign "401" indicates the cross-sectional area of the whole exciting coil, reference sign "402" indicates the cross-sectional area of a single litz wire. According to embodiments of the disclosure, a constant thermal dissipation can be achieved by the exciting coil in the area of a single litz wire shown by 402. Meanwhile the magnetic lens can be equipped with a water-cooling device, and reference sign "403" indicates the cross-section of the cooling device; since the total thermal dissipation of the exciting coil of the magnetic lens is kept constant, the water-cooling device can be as simple as possible.

As an example, in one embodiment, the litz wires contain four single wires, the details of the embodiment are as follows.

Figure 5:
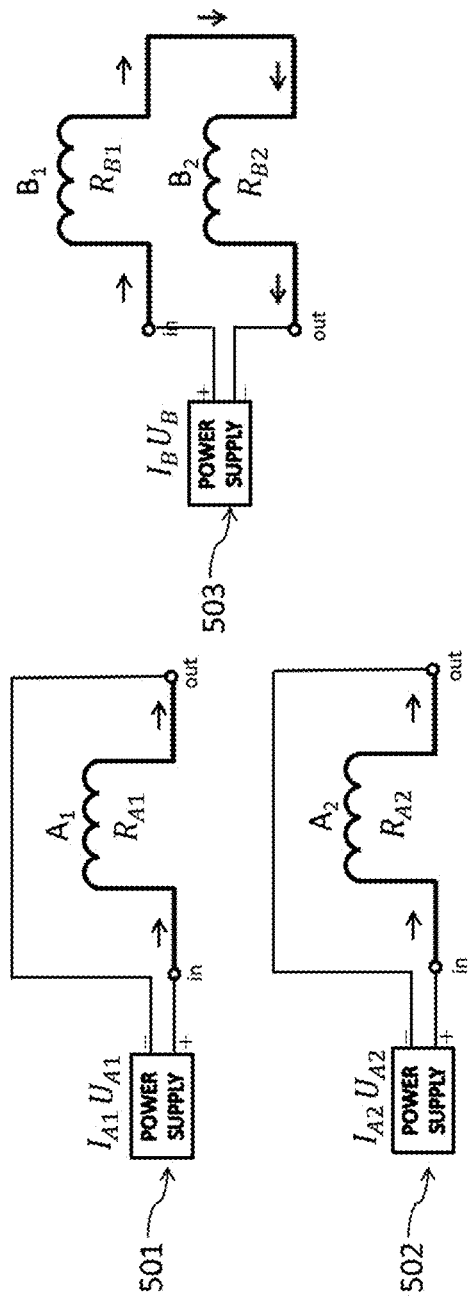
FIG. 5 is a diagram of a manner of controlling the litz wire parameters, according to an embodiment of the disclosure.

FIG. 5 shows the parameters, including current flow directions and magnitudes in the litz wires. The first group of wires are controlled by independent power supplies 501 and 502, the second group of wires are controlled by power supply 503; wherein, the first group of wires comprises two wires $A_1$ and $A_2$ with the same current flow direction; wherein the resistance of $A_1$ is $R_{A1}$, the voltage applied to $A_1$ is $U_{A1}$, the current in $A_1$ is $I_{A1}$, the resistance of $A_2$ is $R_{A2}$, the voltage applied to $A_2$ is $U_{A2}$, the current in $A_2$ is $I_{A2}$, and the required magnetic field intensity is achieved by controlling the magnitudes of the currents $A_1$ and $A_2$.

The second group of wires comprises two wires $B_1$ and $B_2$ with the same current flow direction; wherein the resistance of $B_1$ is $R_{B1}$, the voltage applied to $B_1$ is $U_{B1}$, the current in $B_1$ is $I_{B1}$, the resistance of $B_2$ is $R_{B2}$, the voltage applied to $B_2$ is $U_{B2}$, the current in $B_2$ is $I_{B2}$, $I_{B1}$ is equal to $I_{B2}$, the current flow directions of $B_1$ and $B_2$ are opposite, and therefore the magnetic field produced by $B_1$ and $B_2$ cancels out, that is, the second group of wires has no contribution to the magnetic field and is only used to compensate the thermal dissipation power of the first group of wires.

Specifically, the thermal dissipation power in the first group of wires is: $P_A = I_{A1}^2 R_{A1} + I_{A2}^2 R_{A2} = U_{A1} I_{A1} + U_{A2} I_{A2}$; the thermal dissipation power in the second group of wires is: $P_B = I_B^2 R_{B1} + I_B^2 R_{B2} = U_B I_B$; hence the total thermal dissipation in the two groups is: $P_{total} = P_A + P_B$; in practice, if there is no current in the second group of wires, the thermal dissipation power of the second group of wires is zero. When the maximum intensity of the magnetic field is reached, the thermal dissipation power in the first group of wires is $P_{Amax}$, and thus the total thermal power dissipation is set to be $P_{total}$, which is larger than $P_{Amax}$. Therefore, when the thermal dissipation power in the first group of wires changes from 0 to $P_{Amax}$, in order to keep the total thermal dissipation power $P_{total}$ unchanged, the thermal dissipation power in the second group of wires is: $P_B = P_{total} - P_A$; hence the voltage $U_B$ and the current $I_B$ applied to the second group of wires can be achieved from the equation bellow:

$$I_B = \frac{P_{total} - (I_{A1} U_{A1} + I_{A2} U_{A2})}{U_B} \quad (1)$$

In conclusion, the current excited magnetic lens works as follows: firstly determining the total thermal dissipation power $P_{total}$ of the magnetic lens according to the required maximum magnetic field; and then achieving the required intensity of the magnetic field by adjusting $U_{A1}$, $I_{A1}$, $U_{A2}$, $I_{A2}$; then adjusting $U_B$ and $I_B$ according to equation (1) above to keep the total thermal dissipation power $P_{total}$ unchanged.

Figure 6:
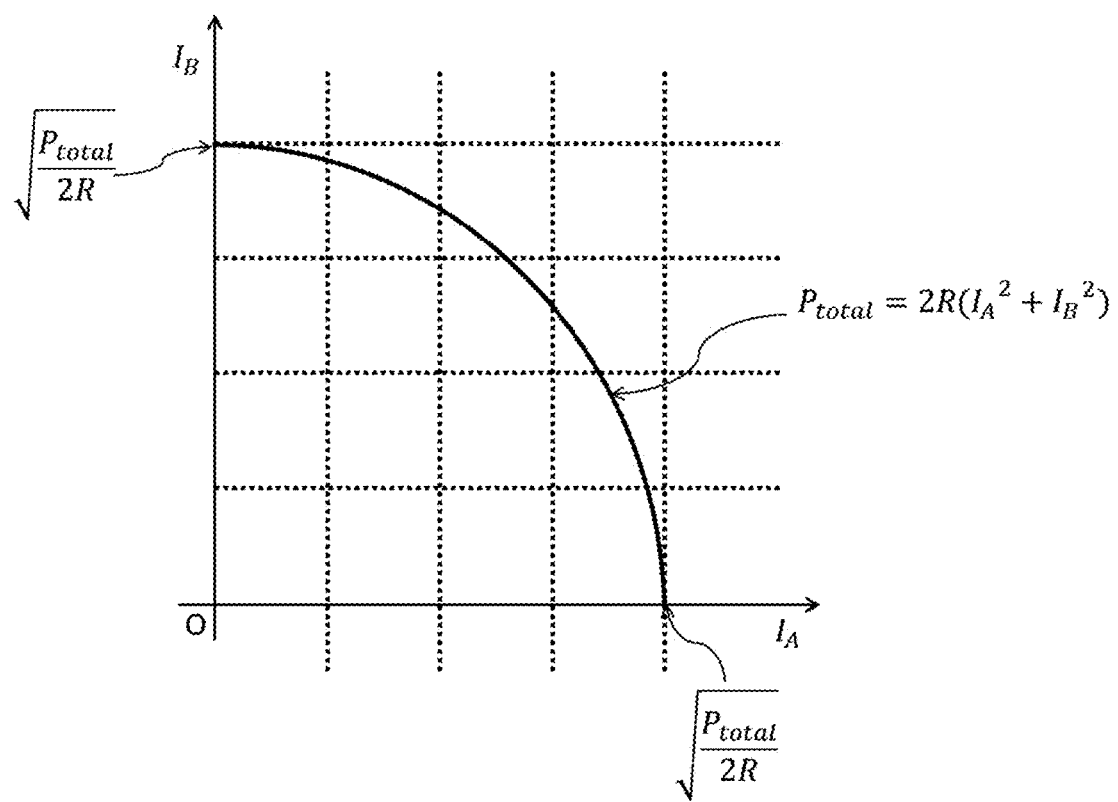
FIG. 6 is a curve showing the relation between $I_1$ and $I_2$, according to an embodiment of the disclosure.

Another embodiment according to the disclosure is presented as follows: the litz wires contain four single wires, according to the above definition, the current is controlled by the power supply controller to make sure $I_{A1} = I_{A2} = I_A$, in a stable condition, $R_{A1} = R_{A2} = R_{B1} = R_{B2} = R$; then $P_A = 2RI_{A2}$, $P_B = 2RI_B^2$, $P_{total} = 2R(I_A^2 + I_B^2)$; and the relation between $I_A$ and $I_B$ is shown in FIG. 6, which is a quarter of circle in the first quadrant.

As an example, in another embodiment, the litz wires contain six single wires, the details of the embodiment are as follows.

Figure 7:
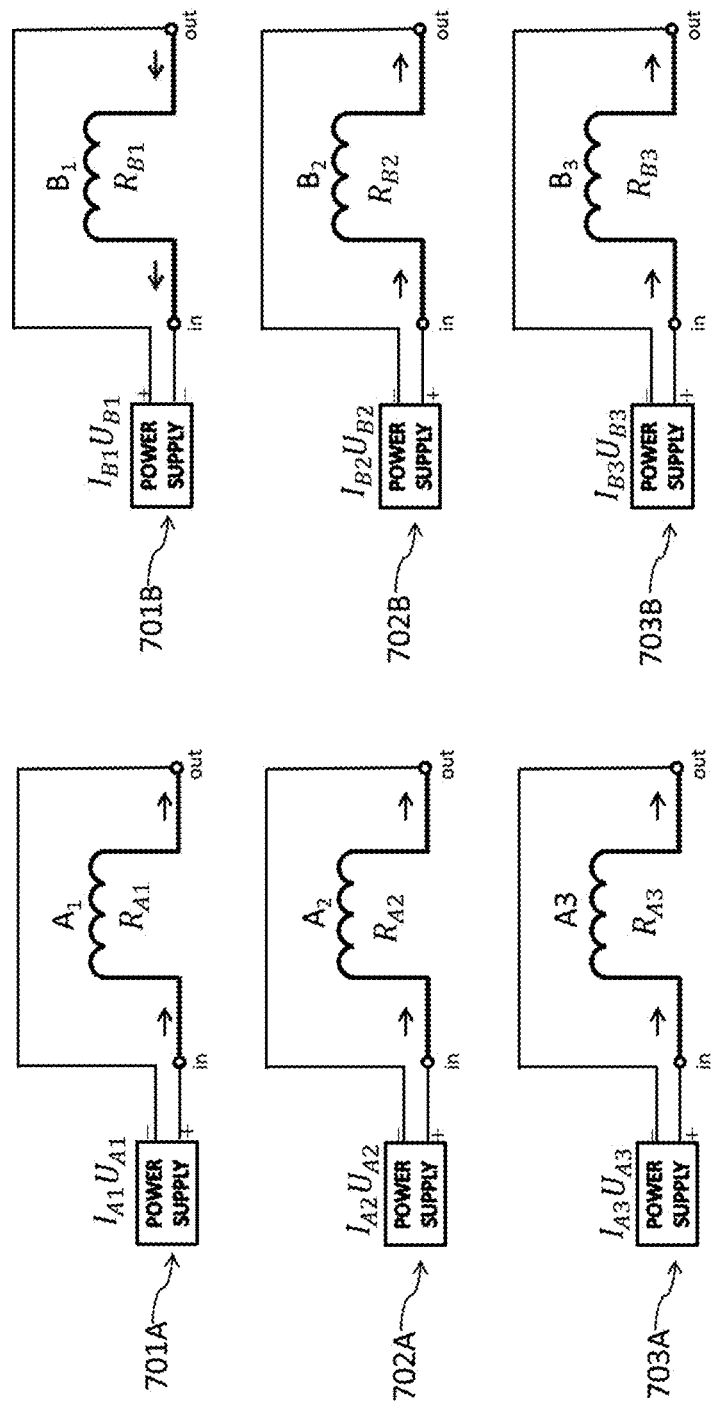
FIG. 7 is a diagram of another manner of controlling the litz wire parameters, according to an embodiment of the disclosure.

FIG. 7 shows a diagram of controlling the current flow direction and current magnitude parameters of the litz wires. The litz wires contain the first group of wires and second group of wires; wherein three wires in the first group are controlled by three independent power supply controllers 701A, 702A, 703A, respectively; three wires in the second group are controlled by three independent power supply controllers 701B, 702B, 703B, respectively. The first group of wires contains three wires: $A_1$, $A_2$, $A_3$ with the same current flow direction; wherein, the resistance of wire $A_1$ is $R_{A1}$, the voltage applied to wire $A_1$ is $U_{A1}$, the current in wire $A_1$ is $I_{A1}$; the resistance of wire $A_2$ is $R_{A2}$, the voltage applied to wire $A_2$ is $U_{A2}$, the current in wire $A_2$ is $I_{A2}$; the resistance of wire $A_3$ is $R_{A3}$, the voltage applied to wire $A_3$ is $U_{A3}$, the current in wire $A_3$ is $I_{A3}$; the required magnetic field intensity of the magnetic lens can be controlled by changing the magnitude of $I_{A1}$, $I_{A2}$, and $I_{A3}$.

The second group of wires also comprises three wires, namely $B_1$, $B_2$, and $B_3$, the current flow direction in $B_2$ and $B_3$ is the same and is opposite to that in $B_1$; the resistance of wire $B_1$ is $R_{B1}$, the voltage applied to wire $B_1$ is $U_{B1}$, the current in wire $B_1$ is $I_{B1}$; the resistance of wire $B_2$ is $R_{B2}$, the voltage applied to wire $B_2$ is $U_{B2}$, the current in wire $B_2$ is $I_{B2}$; the resistance of wire $B_3$ is $R_{B3}$, the voltage applied to wire $B_3$ is $U_{B3}$, the current in wire $B_3$ is $I_{B3}$; the magnitudes of the currents in the second group of wires are controlled so that the magnetic field produced by the second group of wires is zero, and the second group of wires are only used to compensate the thermal dissipation power of the first group of wires.

Specifically, the thermal dissipation power in the first group of wires is:

$$P_A = I_{A1}^2 R_{A1} + I_{A2}^2 R_{A2} + I_{A3}^2 R_{A3} = U_{A1} I_{A1} + U_{A2} I_{A2} + U_{A3} I_{A3} \quad (2)$$

the thermal dissipation power in the second group of wires is:

$$P_B = I_{B1}^2 R_{B1} + I_{B2}^2 R_{B2} + I_{B3}^2 R_{B3} = U_{B1}I_{B1} + U_{B2}I_{B2} + U_{B3}I_{B3}$$

Therefore, the total thermal dissipation in the whole coil is: $P_{total} = P_A + P_B$; in practice, if there is no current in the second group of wires, the thermal dissipation power in the second group of wires is zero. When the required maximum intensity of the magnetic field is reached, the thermal dissipation power in the first group of wires is $P_{Amax}$, and the total thermal power dissipation is set to be $P_{total}$, which is larger than $P_{Amax}$. Therefore, when the thermal dissipation power in the first group of wires changes from 0 to $P_{Amax}$, in order to keep the total thermal dissipation $P_{total}$ unchanged, the thermal dissipation power in the second group of wires is: $P_B = P_{total} - P_A$; and therefore, the relation of electric parameters in the first and second group of wires meets the following equation:

$$P_{total} = U_{A1}I_{A1} + U_{A2}I_{A2} + U_{A3}I_{A3} + U_{B1}I_{B1} + U_{B2}I_{B2} + U_{B3}I_{B3} \quad (4)$$

A simple case according to this embodiment is: the six wires are identical with the same resistance in a stable state: $R = R_{A1} = R_{A2} = R_{A3} = R_{B1} = R_{B2} = R_{B3}$; wherein, three wires in the first group are connected in parallel to ensure: $U_A = U_{A1} = U_{A2} = U_{A3}$; thus $I_A = I_{A1} = I_{A2} = I_{A3}$.

Two wires $B_2$ and $B_3$ in the second group are connected in parallel, and the relation of the current magnitudes of the three wires in the second group is controlled to be: $I_{B1} = 2I_{B2} = 2I_{B3} = 2I_B$.

The voltages applied to three wires in the second group have the relation: $U_{B1} = 2U_{B2} = 2U_{B3} = 2U_B$.

Therefore, the magnetic field produce by the three wires in the second group cancels out; in order to keep the total thermal dissipation power in the two groups unchanged, the algebraic relation of the current and voltage in the second group is:

$$P_{total} = 3U_A I_A + 6U_B I_B = 3I_A^2 R + 6I_B^2 R \quad (5)$$

Figure 8:
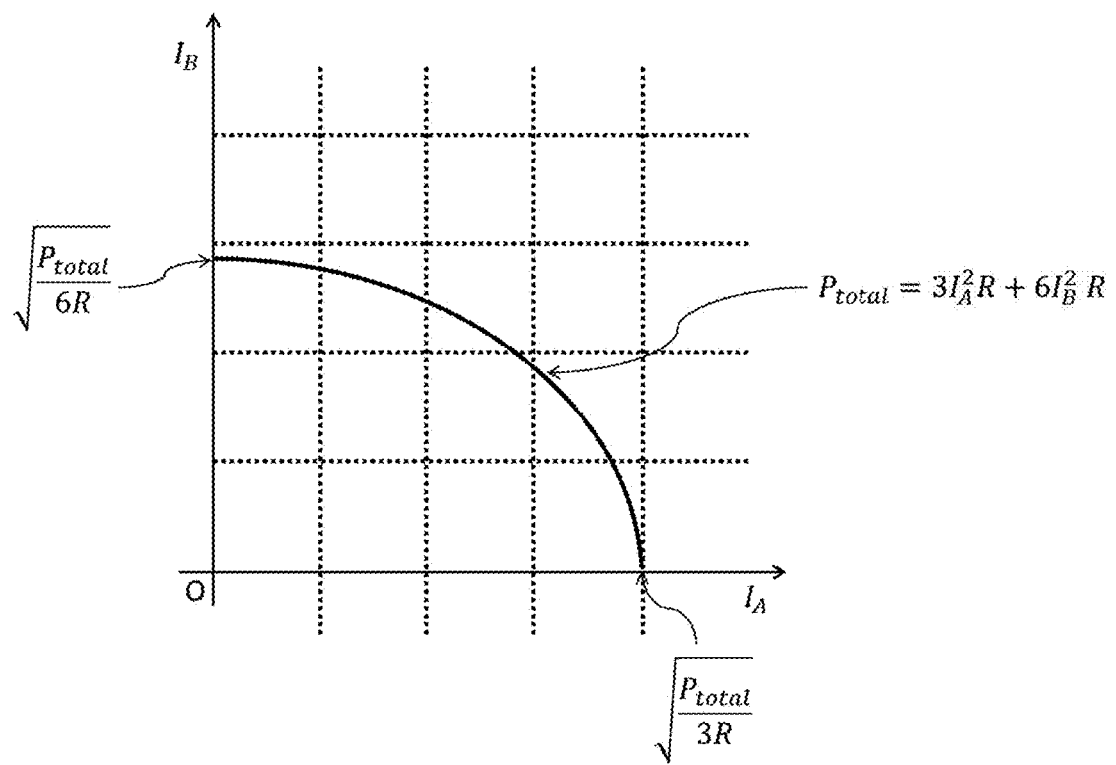
FIG. 8 is a curve showing the relation between $I_A$ and $I_B$, according to an embodiment of the disclosure.

Therefore, the relation between $I_A$ and $I_B$ is shown in FIG. 8, which is a quarter of ellipse in the first quadrant.

Embodiment 2

Figure 9:
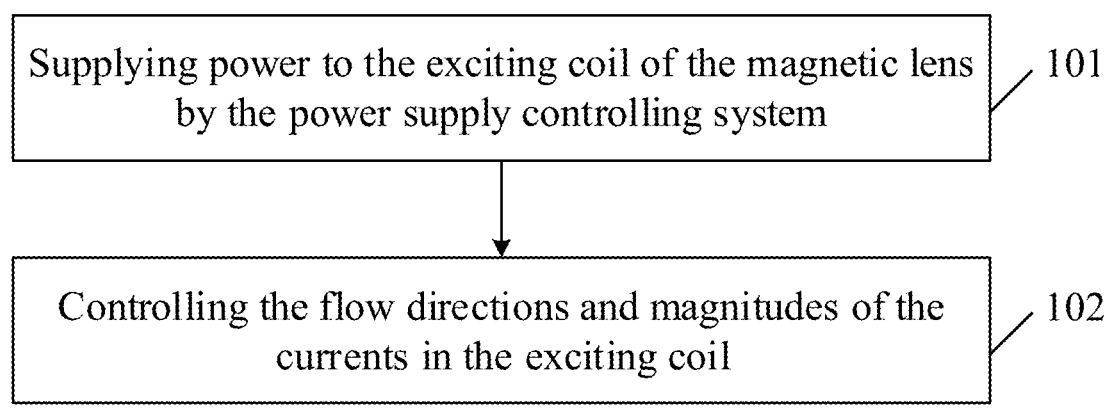
FIG. 9 is a flow chart of a method of controlling characteristic of the magnetic lens, according to an embodiment of the disclosure.

Based on the magnetic lens in the above embodiment, embodiment 2 of the disclosure provides a method for controlling characteristic of the magnetic lens. The exciting coil of the magnetic lens is made up of litz wires. FIG. 9 shows a flowchart of the method for controlling characteristic of the magnetic lens, which includes the following steps.

In step 101, a power supply system in the magnetic lens supplies power to the exciting coil.

Specifically, the litz wires consist of several wires, and these wires can be divided into the first group and the second group; wherein, the number of wires in the first group is the same as that in the second group, and this number is a positive integer larger than one.

As an example, the litz wires consist of four wires, and then any one of the two groups consists of two wires, as shown in FIG. 2, in this case, in the structure of the litz wires, the first group of wires is represented by black wires, and the second group of wires is represented by white wires.

In one embodiment of the disclosure, the power supply controlling system comprises the first power supply controller and the second power supply controller; wherein, the first power supply controller supplies power to the first group of wires, and the second power supply controller supplies power the second group of wires.

The number of the first power supply controller can be one or multiple, and the number of the second power supply controller can also be one or multiple.

In one embodiment of the disclosure, the arrangement and current directions of the wires in the first group and the second group is shown in FIG. 3. In FIG. 3A, two wires in the first group are deployed diagonally, and the current flow direction of the two wires in the first group are same; two wires in the second group are deployed diagonally, and the current flow direction of two wires in the second group are opposite. In FIG. 3B, two wires in the first group are arranged in parallel with the same current flow direction, and two wires in the second group are also arranged in parallel, but with the opposite current flow direction. In FIG. 3C, three wires in the first group are arranged adjacently with the same current flow direction, three wires in the second group are also arranged adjacently, while the current flow direction in two wires is opposite to that in another wire; in this condition, the sum of the current magnitude in the two wires should be equal to the magnitude in the another wire in order to keep the magnetic field produced by the second group of wires to be zero, and the second group of wires are only used to compensate the thermal dissipation in the first group to achieve a constant total thermal dissipation and avoid the temperature fluctuation of the magnetic lens caused by the current change in the first group of wires. In FIG. 3D, three wires in the first group and three wires in the second group are arranged alternatively. The current flow direction of the three wires in the first group is the same; the current flow direction of two wires in the second group is opposite to the current flow direction in another wire; in this condition, the sum of the current magnitude in the two wires should be equal to the magnitude in another wire, such that the magnitudes of the currents in the second group of wires would not influence the intensity of the magnetic field of the magnetic lens, i.e., the magnetic field produced by the second group of wires is kept to be zero, and the second group of wires is only used to compensate the thermal dissipation in the first group, to achieve a constant total thermal dissipation and avoid the temperature fluctuation of the magnetic lens caused by the current change in the first group of wires. Of course, the number of wires is not limited to that in the two cases mentioned above.

In step 102, the flow directions and magnitudes of the currents in the exciting coil is controlled.

Specifically, the first power supply controller controls the first group of wires to have a same current flow direction and controls the magnitudes of the currents in the first group of wires, to change the intensity of the magnetic field in the magnetic lens.

When the number of the second group of wires is an even number, the second power supply controller is arranged to supply power to the second group of wires, and controls the wires in the second group to have opposite current flow directions; since the current directions in the second group of wires are opposite to each other, the magnetic field intensity generated by the second group of wires can be set to be zero by controlling the magnitudes of the currents in the second group of wires; the second group of wires is only used to compensate the thermal dissipation in the first group of wires, in order to achieve a constant total thermal dissipation power in the whole coil and avoid the temperature fluctuation of the magnetic lens when the current in the first group of wires changes.

As an example, in one embodiment, the litz wires contain four single wires, the details of the embodiment are as follows.

FIG. 5 shows the parameters, including current flow direction and magnitude in the litz wires. The first group of wires are controlled by independent power supplies 501 and 502, the second group of wires are controlled by power supply 503; wherein, the first group of wires comprises two wires $A_1$ and $A_2$ with the same current flow direction; wherein the resistance of $A_1$ is $R_{A1}$, the voltage applied to $A_1$ is $U_{A1}$, the current in $A_1$ is $I_{A1}$, the resistance of $A_2$ is $R_{A2}$, the voltage applied to $A_2$ is $U_{A2}$, the current in $A_2$ is $I_{A2}$, and the required magnetic field intensity is achieved by controlling the magnitudes of the currents $A_1$ and $A_2$.

The second group of wires comprises two wires $B_1$ and $B_2$ with the same current flow direction; wherein the resistance of $B_1$ is $R_{B1}$, the voltage applied to $B_1$ is $U_{B1}$, the current in $B_1$ is $I_{B1}$, the resistance of $B_2$ is $R_{B2}$, the voltage applied to $B_2$ is $U_{B2}$, the current in $B_2$ is $I_{B2}$, $I_{B1}$ is equal to $I_{B2}$, the current flow directions of $B_1$ and $B_2$ are opposite, and therefore the magnetic field produced by $B_1$ and $B_2$ cancels out, that is, the second group of wires has no contribution to the magnetic field and is only used to compensate the thermal dissipation power of the first group of wires.

Specifically, the thermal dissipation power in the first group of wires is: $P_A = I_{A1}^2 R_{A1} + I_{A2}^2 R_{A2} = U_{A1} I_{A1} + U_{A2} I_{A2}$; the thermal dissipation power in the second group of wires is: $P_B = I_B^2 R_{B1} + I_B^2 R_{B2} = U_B I_B$; hence the total thermal dissipation in the two groups is: $P_{total} = P_A + P_B$; in practice, if there is no current in the second group of wires, the thermal dissipation power of the second group of wires is zero. When the maximum intensity of the magnetic field is reached, the thermal dissipation power in the first group of wires is $P_{Amax}$, and thus the total thermal power dissipation is set to be $P_{total}$, which is larger than $P_{Amax}$. Therefore, when the thermal dissipation power in the first group of wires changes from 0 to $P_{Amax}$, in order to keep the total thermal dissipation power $P_{total}$ unchanged, the thermal dissipation power in the second group of wires is: $P_B = P_{total} - P_A$; hence the voltage $U_B$ and the current $I_B$ applied to the second group of wires can be achieved from the equation bellow:

$$I_B = \frac{P_{total} - (I_{A1} U_{A1} + I_{A2} U_{A2})}{U_B} \quad (1)$$

In conclusion, the current excited magnetic lens works as follows: firstly determining the total thermal dissipation power $P_{total}$ of the magnetic lens according to the required maximum magnetic field; and then achieving the required intensity of the magnetic field by adjusting $U_{A1}$, $I_{A1}$, $U_{A2}$, $I_{A2}$; then adjusting $U_B$ and $I_B$ according to equation (1) above to keep the total thermal dissipation power $P_{total}$ unchanged.

Another embodiment according to the disclosure is presented as follows: the litz wires contain four single wires, according to the above definition, the current is controlled by the power supply controller to make sure $I_{A1} = I_{A2} = I_A$, in a stable condition, $R_{A1} = R_{A2} = R_{B1} = R_{B2} = R$; then $P_A = 2RI_A^2$, $P_B = 2RI_B^2$, $P_{total} = 2R(I_A^2 + I_B^2)$; and the relation between $I_A$ and $I_B$ is shown in FIG. 6, which is a quarter of circle in the first quadrant.

As an example, in another embodiment, the litz wires contain six single wires, the details of the embodiment are as follows.

FIG. 7 shows a diagram of controlling the current flow direction and current magnitude parameters of the litz wires.

The litz wires contain the first group of wires and second group of wires; wherein three wires in the first group are controlled by three independent power supply controllers 701A, 702A, 703A, respectively; three wires in the second group are controlled by three independent power supply controllers 701B, 702B, 703B, respectively. The first group of wires contains three wires: $A_1$, $A_2$, $A_3$ with the same current flow direction; wherein, the resistance of wire $A_1$ is $R_{A1}$, the voltage applied to wire $A_1$ is $U_{A1}$, the current in wire $A_1$ is $I_{A1}$; the resistance of wire $A_2$ is $R_{A2}$, the voltage applied to wire $A_2$ is $U_{A2}$, the current in wire $A_2$ is $I_{A2}$; the resistance of wire $A_3$ is $R_{A3}$, the voltage applied to wire $A_3$ is $U_{A3}$, the current in wire $A_3$ is $I_{A3}$; the required magnetic field intensity of the magnetic lens can be controlled by changing the magnitude of $I_{A1}$, $I_{A2}$, and $I_{A3}$.

The second group of wires also comprises three wires, namely $B_1$, $B_2$, and $B_3$, the current flow direction in $B_2$ and $B_3$ is the same and is opposite to that in $B_1$; the resistance of wire $B_1$ is $R_{B1}$, the voltage applied to wire $B_1$ is $U_{B1}$, the current in wire $B_1$ is $I_{B1}$; the resistance of wire $B_2$ is $R_{B2}$, the voltage applied to wire $B_2$ is $U_{B2}$, the current in wire $B_2$ is $I_{B2}$; the resistance of wire $B_3$ is $R_{B3}$, the voltage applied to wire $B_3$ is $U_{B3}$, the current in wire $B_3$ is $I_{B3}$; the magnitudes of the currents in the second group of wires are controlled so that the magnetic field produced by the second group of wires is zero, and the second group of wires are only used to compensate the thermal dissipation power of the first group of wires.

Specifically, the thermal dissipation power in the first group of wires is:

$$P_A = I_{A1}^2 R_{A1} + I_{A2}^2 R_{A2} + I_{A3}^2 R_{A3} = U_{A1} I_{A1} + U_{A2} I_{A2} + U_{A3} I_{A3} \quad (2)$$

the thermal dissipation power in the second group of wires is:

$$P_B = I_{B1}^2 R_{B1} + I_{B2}^2 R_{B2} + I_{B3}^2 R_{B3} = U_{B1} I_{B1} + U_{B2} I_{B2} + U_{B3} I_{B3} \quad (3)$$

Therefore, the total thermal dissipation in the whole coil is: $P_{total} = P_A + P_B$; in practice, if there is no current in the second group of wires, the thermal dissipation power in the second group of wires is zero. When the required maximum intensity of the magnetic field is reached, the thermal dissipation power in the first group of wires is $P_{Amax}$, and the total thermal power dissipation is set to be $P_{total}$, which is larger than $P_{Amax}$. Therefore, when the thermal dissipation power in the first group of wires changes from 0 to $P_{Amax}$, in order to keep the total thermal dissipation $P_{total}$ unchanged, the thermal dissipation power in the second group of wires is: $P_B = P_{total} - P_A$; and therefore, the relation of electric parameters in the first and second group of wires meets the following equation:

$$P_{total} = U_{A1} I_{A1} + U_{A2} I_{A2} + U_{A3} I_{A3} + U_{B1} I_{B1} + U_{B2} I_{B2} + U_{B3} I_{B3} \quad (4)$$

A simple case according to this embodiment is: the six wires are identical with the same resistance in a stable state: $R = R_{A1} = R_{A2} = R_{A3} = R_{B1} = R_{B2} = R_{B3}$; wherein, three wires in the first group are connected in parallel to ensure: $U_A = U_{A1} = U_{A2} = U_{A3}$; thus $I_A = I_{A1} = I_{A2} = I_{A3}$.

Two wires $B_2$ and $B_3$ in the second group are connected in parallel, and the relation of the current magnitudes of the three wires in the second group is controlled to be: $I_{B1} = 2I_{B2} = 2I_{B3} = 2I_B$.

The voltages applied to three wires in the second group have the relation: $U_{B1} = 2U_{B2} = 2U_{B3} = 2U_B$.

Therefore, the magnetic field produce by the three wires in the second group cancels out; in order to keep the total thermal dissipation power in the two groups unchanged, the algebraic relation of the current and voltage in the second group is:

$$P_{total}=3U_AI_A+6U_BI_B=3I_A^2R+6I_B^2R \quad (5)$$

Therefore, the relation between $I_A$ and $I_B$ is shown in FIG. 8, which is a quarter of ellipse in the first quadrant.

What described are merely embodiments of the disclosure, and not intended to limit the scope of protection of the disclosure.

INDUSTRIAL APPLICABILITY

With an exciting coil made of litz wires, as well as the current controlling method with the power supply controlling system, a magnetic lens is presented in the disclosure. The litz wires comprise the first group of wires and the second group of wires, and the power supply controlling system comprises the first power supply controller and the second power supply controller. The first power supply controller supplies power to the first group of wires and the second power supply controller supplies power to the second group of wires. a magnetic field with an ideal intensity is created by controlling the current magnitudes and flow directions in the first group of wires. The current magnitudes and flow directions in the second group of wires are controlled to compensate the thermal dissipation in the first group of wires. Therefore, a magnetic lens with a constant thermal dissipation, independent of the magnetic field intensity, is invented.

What is claimed is:

1. A magnetic lens, comprising: a magnetic yoke, an exciting coil, and a power supply controlling system; wherein,
   the magnetic yoke is at outside of the exciting coil and surrounds the exciting coil;
   the exciting coil is made up of litz wires; and
   the power supply controlling system is arranged to supply power to the exciting coil and control flow directions and magnitudes of currents of the exciting coil,
   wherein each of the litz wires comprises a first group of wires and a second group of wires, both a number of wires in the first group and a number of wires in the second group being positive integers larger than one;
   wherein the power supply controlling system is arranged to:
      simultaneously control currents in the wires in the first group to have a same flow direction and adjust magnitudes of the currents in the wires in the first group, to vary a magnetic field intensity of the magnetic lens to achieve a required magnetic field intensity, and adjust magnitudes of currents in the wires in the second group to keep a total thermal power of the first group of wires and the second group of wires unchanged within the litz wire even when the magnetic field intensity of the magnetic lens varies; and
      control the currents in the wires in the second group to make a sum of magnitudes of currents with a positive flow direction is equal to a sum of magnitudes of currents with a negative flow direction, such that a magnetic field generated by the second group of wires is zero.

2. The magnetic lens according to claim 1, wherein the power supply controlling system comprises: a first power supply controller and a second power supply controller; wherein,
   the first power supply controller is arranged to supply power to the first group of wires and control the flow directions and magnitudes of the currents in the wires of the first group;
   the second power supply controller is arranged to supply power to the second group of wires and control the flow directions and magnitudes of the currents in the wires of the second group.

3. The magnetic lens according to claim 2, wherein each of the first power supply controller and the second power supply controller comprises one or more power supply controllers.

4. A method for controlling a magnetic lens, wherein the magnetic lens has an exciting coil made up of litz wires, the method comprising:
   supplying power to the exciting coil by a power supply controlling system in the magnetic lens, and
   controlling flow directions and magnitudes of currents in the exciting coil, to vary a magnetic field intensity of the magnetic lens and keep a thermal power unchanged,
   wherein each of the litz wires comprises a first group of wires and a second group of wires, both a number of wires in the first group and a number of wires in the second group being positive integers larger than one; and
   wherein controlling flow directions and magnitudes of currents in the exciting coil, to vary a magnetic field intensity of the magnetic lens and keep a thermal power unchanged:
   simultaneously controlling currents in the wires of the first group to have a same flow direction and adjusting magnitudes of the currents in the wires of the first group, to vary the magnetic field intensity of the magnetic lens to achieve a required magnetic field intensity, and adjusting magnitudes of currents in the wires of the second group to keep a total thermal power of the first group of wires and the second group of wires unchanged within the litz wire even when the magnetic field intensity of the magnetic lens varies; and
   controlling the currents in the wires of the second group to make a sum of magnitudes of currents with a positive flow direction is equal to a sum of magnitudes of currents with a negative flow direction, such that a magnetic field generated by the second group of wires is zero.

5. The method according to claim 4, wherein the power supply controlling system comprises: a first power supply controller and a second power supply controller; and
   wherein the supplying power to the exciting coil by the power supply controlling system and controlling flow directions and magnitudes of currents in the exciting coil comprises:
   supplying, by the first power supply controller, power to the first group of wires, and controlling, by the first power supply controller, the flow directions and the magnitudes of currents in the wires of the first group; and
   supplying, by the second power supply controller, power to the second group of wires, and controlling, by the second power supply controller, the flow directions and the magnitudes of the currents in the wires of the second group.

6. The method according to claim 5, wherein each of the first power supply controller and the second power supply controller comprises one or more power supply controllers.

* * * * *